United States Patent
Liu et al.

(10) Patent No.: US 10,465,287 B2
(45) Date of Patent: Nov. 5, 2019

(54) SEMICONDUCTOR DEVICE AND METHOD OF FORMING THE SAME

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Chih-Chien Liu, Taipei (TW); Pin-Hong Chen, Tainan (TW); Tsun-Min Cheng, Changhua County (TW); Yi-Wei Chen, Taichung (TW)

(73) Assignees: UNITED MICROELECTRONCIS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/919,191

(22) Filed: Mar. 12, 2018

(65) Prior Publication Data
US 2019/0249297 A1    Aug. 15, 2019

(30) Foreign Application Priority Data
Feb. 9, 2018    (CN) .......................... 2018 1 0133700

(51) Int. Cl.
| | |
|---|---|
| *C23C 16/455* | (2006.01) |
| *H01L 21/768* | (2006.01) |
| *H01L 23/544* | (2006.01) |
| *H01L 21/285* | (2006.01) |
| *H01L 21/321* | (2006.01) |
| *C23C 16/02* | (2006.01) |
| *C23C 16/34* | (2006.01) |

(52) U.S. Cl.
CPC ...... *C23C 16/4554* (2013.01); *C23C 16/0272* (2013.01); *C23C 16/34* (2013.01); *C23C 16/45531* (2013.01); *C23C 16/45534* (2013.01); *H01L 21/28556* (2013.01); *H01L 21/3212* (2013.01); *H01L 21/7684* (2013.01); *H01L 21/76877* (2013.01); *H01L 23/544* (2013.01)

(58) Field of Classification Search
CPC ...................... H01L 21/76877; C23C 16/0272
See application file for complete search history.

(56) References Cited

U.S. PATENT DOCUMENTS

| | | | | |
|---|---|---|---|---|
| 5,407,698 A | * | 4/1995 | Emesh ................... | C23C 16/02 257/E21.585 |
| 5,686,355 A | * | 11/1997 | Sumi ................. | H01L 21/32051 438/654 |

(Continued)

*Primary Examiner* — Victoria K. Hall
(74) *Attorney, Agent, or Firm* — Winston Hsu (57) ABSTRACT

A semiconductor device includes a substrate, a dielectric layer, a first tungsten layer, an interface layer and a second tungsten layer. The dielectric layer is disposed on the substrate and has a first opening and a second opening larger than the first opening. The first tungsten layer is filled in the first opening and is disposed in the second opening. The second tungsten layer is disposed on the first tungsten layer in the second opening, wherein the second tungsten layer has a grain size gradually increased from a bottom surface to a top surface. The interface layer is disposed between the first tungsten layer and the second tungsten layer, wherein the interface layer comprises a nitrogen containing layer. The present invention further includes a method of forming a semiconductor device.

10 Claims, 6 Drawing Sheets

(56) References Cited

U.S. PATENT DOCUMENTS

| | | | | |
|---|---|---|---|---|
| 5,731,225 A * | 3/1998 | Yamamori | ........ | H01L 21/76838 |
| | | | | 438/653 |
| 5,804,249 A * | 9/1998 | Sukharev | .............. | C23C 16/045 |
| | | | | 216/18 |
| 5,956,609 A * | 9/1999 | Lee | ................... | H01L 21/76843 |
| | | | | 257/E21.584 |
| 6,331,483 B1 * | 12/2001 | Ishizuka | ............. | C23C 16/0281 |
| | | | | 257/E21.17 |
| 6,413,853 B2 * | 7/2002 | Jang | .................... | C23C 16/0272 |
| | | | | 257/E21.168 |
| 6,475,907 B1 * | 11/2002 | Taguwa | ............ | H01L 21/76843 |
| | | | | 257/E21.591 |
| 6,498,095 B2 * | 12/2002 | Matsuura | .......... | H01L 21/28556 |
| | | | | 257/E21.17 |
| 6,524,956 B1 * | 2/2003 | Tian | .................. | H01L 21/28556 |
| | | | | 257/E21.17 |
| 6,579,788 B1 * | 6/2003 | Jones | ................ | H01L 21/76843 |
| | | | | 257/E21.585 |
| 6,645,863 B2 | 11/2003 | Takewaka et al. | | |
| 7,005,372 B2 | 2/2006 | Levy et al. | | |
| 7,233,073 B2 * | 6/2007 | Nishimura | ........ | H01L 21/28556 |
| | | | | 257/774 |
| 7,795,137 B2 * | 9/2010 | Saito | .................. | H01L 21/76898 |
| | | | | 257/519 |
| 9,704,919 B1 * | 7/2017 | Lu | ......................... | H01L 27/228 |
| 10,256,142 B2 * | 4/2019 | Chandrashekar | ........................... | |
| | | | | H01L 21/28556 |
| 2003/0198086 A1 * | 10/2003 | Shukuri | ................. | B82Y 10/00 |
| | | | | 365/185.18 |
| 2005/0029010 A1 * | 2/2005 | Ahn | .................. | H01L 21/76877 |
| | | | | 174/255 |
| 2005/0272258 A1 * | 12/2005 | Morita | ................ | H01L 21/2855 |
| | | | | 438/660 |
| 2009/0238958 A1 * | 9/2009 | Sinha | ....................... | C25D 5/08 |
| | | | | 427/123 |
| 2017/0125354 A1 * | 5/2017 | Zhang | ............... | H01L 21/28556 |

* cited by examiner

SEMICONDUCTOR DEVICE AND METHOD OF FORMING THE SAME

BACKGROUND OF THE INVENTION

1. Field of the Invention

The present invention relates to a semiconductor device and a method of forming the same, and more particularly, to a semiconductor device having metal lines and a method of forming the same.

2. Description of the Prior Art

In the modern society, the micro-processor systems composed of integrated circuits (IC) have been utilized in diverse fields such as automatic control electronics, mobile communication devices and personal computers. With the development of technology and the increase of original applications for electrical products, the IC devices are becoming smaller, more delicate and more diversified.

As well known in the art, an IC device is produced from dies that are fabricated by conventional semiconductor manufacturing processes. The process for manufacturing a die starts with a wafer: first, different regions are marked on the wafer; secondly, conventional semiconductor manufacture processes such as deposition, photolithography, etching or planarization are used to form each circuit trace. As the semiconductor industry has progressed into nanometer technology process nodes in pursuit of highly integrated and high-speed operation, current techniques utilize miniaturized through holes and inter-layer dielectric layers to form a multilayered interconnected wiring structure to electrically connect a metal gate and source/drain regions of a transistor, thereby providing signal input/output pathways for the transistor. Then, each region of the wafer is diced to form a die, and the dies are then assembled to form a chip, so as to obtain a complete assembling unit.

For these reasons, how to efficiently improve the current structure of the semiconductor device, as well as the method of forming the same, has become an important task in this field.

SUMMARY OF THE INVENTION

The present invention therefore provides a semiconductor device, in which two tungsten layers are disposed sequentially within an opening. By making a grain size of the top tungsten layer being gradually increased from a bottom surface to a top surface, the grain size of the top tungsten layer may not be over increased with the film thickness, and the rough surface of the tungsten layer may be improved.

The present invention therefore further provides a semiconductor device, in which a tungsten stacked structure is disposed within an opening. The tungsten stacked structure includes two tungsten layers and an interface layer between the two tungsten layers, so that, the grain size of the tungsten layer may not be over increased, and the rough surface of the tungsten layer may be improved.

The present invention therefore further provides a method of forming a semiconductor device, in which a treatment process is performed between two stepped tungsten depositing processes, to interact with the original grain growth of the tungsten layer. In this way, the tungsten layer may obtain a reduced grain size after the treatment process.

To achieve the purpose described above, the present invention provides a semiconductor device, including a substrate, a dielectric layer, a first tungsten layer and a second tungsten layer. The dielectric layer is disposed on the substrate and has a first opening and a second opening with a diameter larger than a diameter of the first opening. The first tungsten layer is disposed in the first opening and the second opening to fill the first opening. The second tungsten layer is disposed on the first tungsten layer, and a grain size of the second tungsten layer is gradually increased from a bottom surface to a top surface of the second tungsten layer.

To achieve the purpose described above, the present invention provides a semiconductor device, including a substrate, a dielectric layer, a first tungsten layer and a tungsten stacked structure. The dielectric layer is disposed on the substrate and has a first opening and a second opening with a diameter larger than a diameter of the first opening. The first tungsten layer fills up the first opening. The tungsten stacked structure is disposed in the second opening, and the tungsten stacked structure comprises the first tungsten layer, an interface layer and a second tungsten layer stacked sequentially from bottom to top.

To achieve the purpose described above, the present invention provides a method of forming a semiconductor device, including the following steps. First of all, a dielectric layer is formed on a substrate, and the dielectric layer has a first opening and a second opening with a diameter larger than a diameter of the first opening. Next, a first tungsten layer is formed to completely fill the first opening and to partially fill the second opening. Then, a treatment process is performed, to form an interface layer on the first tungsten layer. Finally, a second tungsten layer is formed on the interface layer.

The present invention utilizes a two-step CVD process to form two tungsten layers, and further utilizes a treatment process between the two CVD processes to inhibit the grain growth of tungsten by introducing a suitable gas or radicals to a top surface of the bottom tungsten layer to interfere with the original crystallization, and to transfer the grain growth of tungsten thereof into amorphous tungsten. That is, the top tungsten layer deposited on the bottom tungsten layer may be recrystallized to obtain a relative smaller grain size instead of continuously extended along the original crystallization of the bottom tungsten layer. In this way, the forming method of the present invention is capable of improving issues of the oversized grain of the top tungsten layer, and the subsequent processes such as the dicing process will no longer be affected by these issues. In this way, the semiconductor device obtained via aforementioned forming method in the present invention may therefore gain a better element performance.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 3 are schematic diagrams illustrating a method of forming a semiconductor device according to a first preferred embodiment of the present invention, wherein:

FIG. 4 to FIG. 6 are schematic diagrams illustrating a method of forming a semiconductor device according to a second preferred embodiment of the present invention, wherein:

FIG. 7 to FIG. 8 are schematic diagrams illustrating a method of forming a semiconductor device according to a third preferred embodiment of the present invention, wherein:

FIG. 9 to FIG. 10 are schematic diagrams illustrating a method of forming a semiconductor device according to a fourth preferred embodiment of the present invention, wherein:

DETAILED DESCRIPTION

To provide a better understanding of the presented invention, preferred embodiments will be described in detail. The preferred embodiments of the present invention are illustrated in the accompanying drawings with numbered elements.

Figure 1:
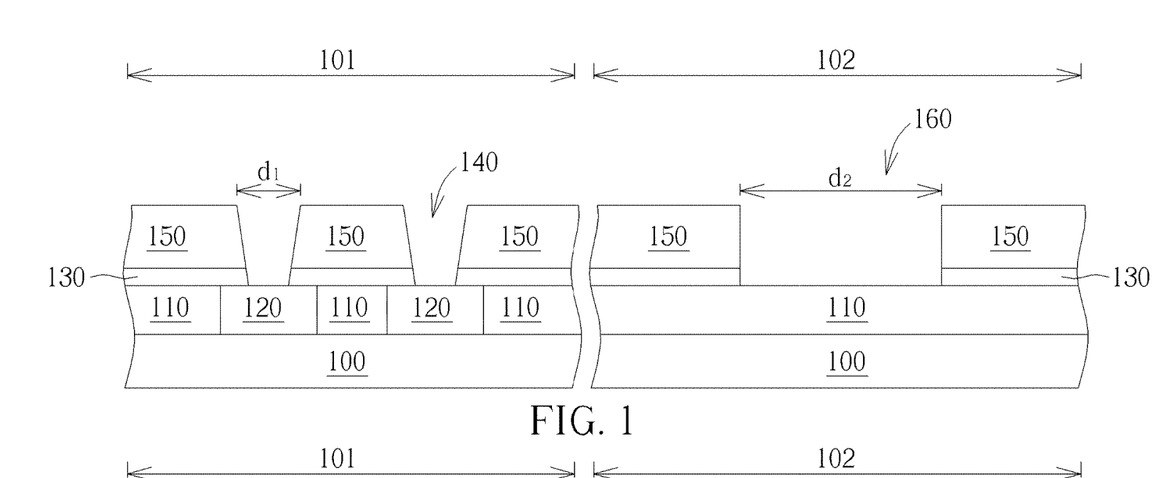
FIG. 1 is a schematic cross-sectional view showing a semiconductor device after forming an opening.
Figure 2:
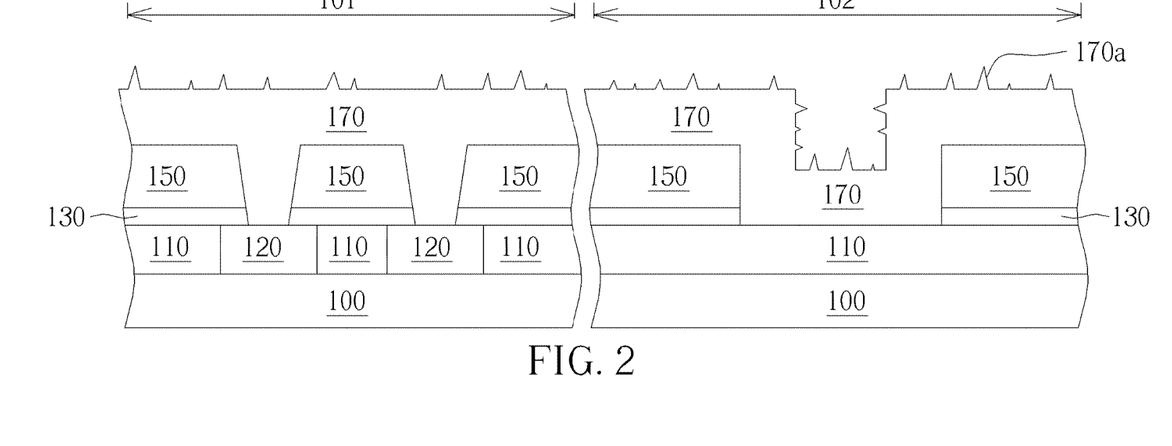
FIG. 2 is a schematic cross-sectional view showing a semiconductor device after forming a tungsten layer.
Figure 3:
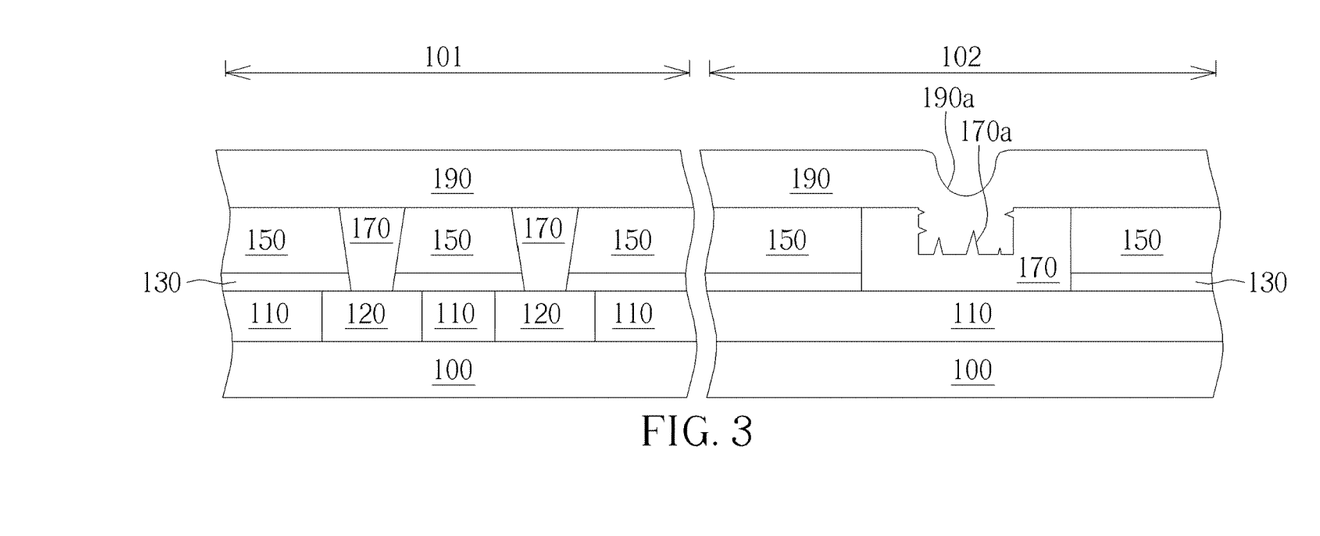
FIG. 3 is a schematic cross-sectional view showing a semiconductor device after forming a metal layer.

Referring to FIG. 1 to FIG. 3, a method of forming a semiconductor device according to the first preferred embodiment of the present invention is shown. Firstly, a substrate 100 for example a semiconductor substrate like a silicon substrate, a silicon containing substrate or a silicon-on-insulator (SOI) substrate is provided, and two regions 101, 102 are defined on the substrate 100, to serve as a center region and an edge region respectively, but is not limited thereto. Also, the substrate 100 includes at least one conductive region 120 formed within the region 101, and the conductive region 120 may be any kind of conductive unit or metal contact. For example, the conductive region 120 of the present embodiment may be a contact plug, a via plug or a metal line formed in a dielectric layer 110, as shown in FIG. 1.

Next, openings 140, 160 are respectively formed in the substrate 100, within the two regions 101, 102, to expose a portion of the conductive region 120 from a bottom of each opening 140, and to expose a portion of the dielectric layer 110 from a bottom of each opening 160. In the present embodiment, the openings 140, 160 are formed in a stop layer 130 and a dielectric layer 150 stacked one over another on the substrate. The stop layer 130 is formed between the two dielectric layers 110, 150, and includes a dielectric material such as silicon oxynitride (SiON) or silicon carbonitride (SiCN), so that, the stop layer 130 may be performed like an etching stop layer while forming the openings 140, 160. It is noted that, the openings 140 formed in the region 101 have a relative smaller diameter d1, and the opening 160 formed in the region 102 has a relative larger diameter d2, for example being two times or three times larger than the diameter d1, but is not limited thereto.

Then, a chemical vapor deposition (CVD) is performed to form a tungsten (W) layer 170. While performing the CVD process to form the tungsten layer 170, the grain growth of tungsten are extended upwardly along the crystallization thereof, to firstly fill the openings 140 with the smaller diameter d1, and to further cover on a top surface of the dielectric layer 150. Meanwhile, the formed tungsten layer 170 is partially filled in the opening 160 with a larger diameter d2, as shown in FIG. 2. Furthermore, the grain size of tungsten is gradually increased with the film thickness of the tungsten layer 170. In other words, the tungsten layer 170 that is close to a bottom surface (namely the surface directly in contact with the conductive region 120 or the dielectric layer 110) thereof has a relative smaller grain size of tungsten, for example being about 1 nanometers (nm) to 10 nm, and the tungsten layer 170 that is close to a top surface (namely the surface away from the conductive region 120 or the dielectric layer 110) thereof has a relative larger grain size of tungsten, for example being about 80 nm to 100 nm. That is, as shown in FIG. 2, the comparatively larger grain size of tungsten at the top surface of the tungsten layer 170 leads to a comparatively rough profile and an uneven surface 170a of the tungsten layer 170.

As shown in FIG. 3, a planarization process such as a chemical mechanical polishing/planarization (CMP) process is performed, to completely remove the tungsten layer 170 formed on the top surface of the dielectric layer 150. In this way, the tungsten layer 170 formed within the openings 140 may therefore obtain a planar top surface, so as to function like metal lines. On the other hand, since the tungsten layer 170 formed within the opening 160 only partially fills the opening 160, the uneven surface 170a thereof still remains in the opening 160 without being removed in the aforementioned CMP process. The tungsten layer 170 formed within the opening 160 is then functions like an alignment mark in the subsequent process. Next, a conductive layer 190 such as an aluminum (Al) layer is formed on the dielectric layer 150, to cover the tungsten layer 170 within the two regions 101, 102. However, as shown in FIG. 3, the conductive layer 190 formed within the region 102 may also have a comparative rough, uneven surface 190a due to the uneven surface 170a of the tungsten layer 170 disposed underneath.

Following these, the conductive layer 190 disposed within the region 101 may be patterned, and a protection layer such as a passivation layer (not shown in the drawings) may be formed then. The patterned conductive layer (not shown in the drawings) directly contacts the conductive region 120 underneath, and a portion of the dielectric layer 150 may therefore be exposed from the patterned conductive layer. That is, the protection layer may cover on the entire conductive layer 190 within the region 102, and the patterned conductive layer and the exposed dielectric layer 150 within the region 101, with a portion (not shown in the drawings) of the conductive layer 190 being exposed from the protection layer. Then, a connection element such as a solder bond (not shown in the drawings) may be formed via a package process like surface-mount technology (SMT), to electrically connect the exposed portion of the conductive layer 190 to other elements. Also, the tungsten layer 170 and the conductive layer 190 formed within the region 102 are not electrically connected to any element, so as to serve as an alignment mark in a subsequent lithography or dicing process.

Through the above mentioned steps, the method of forming a semiconductor device in the first preferred embodiment is completed. According to the present forming method, the CVD process is used to form the tungsten layer 170, to completely fill the openings 140 with a smaller diameter and to partially fill the opening 160 with a larger diameter. Then, the conductive layer is formed after performing the planarization process, to make the tungsten layer 170 disposed within the openings 140, 160 to function like a metal line and an alignment mark respectively. Thus, the semiconductor device obtained through the aforementioned forming method includes the dielectric layer 150 disposed on the substrate 100, the openings 140, 160 with different diameters in the dielectric layer 150, the tungsten layer 170 disposed in the openings 140, 160, and the conductive layer 190 disposed on the tungsten layer 170. It is noted that, the tungsten layer 170 completely fills the openings 140 and only partially fills the opening 160, and the grain size of tungsten is gradually increased from the bottom surface of the tungsten layer 170 to the top surface of the tungsten layer 170 of the tungsten layer 170. The larger grain size such as about 80 nm to 100 nm at the top surface of the tungsten layer 170 leads to the comparatively rough profile the uneven surface 170a of the tungsten layer 170. Furthermore, the conductive layer 190 disposed on such uneven surface 170a of the tungsten layer 170 also has the comparatively rough, uneven surface 190a, and such rough, uneven profile of the conductive layer 190 and the tungsten layer 170 may easily affect the normal function of the alignment mark during the subsequent dicing process. In some situation, although the uneven surface may be improved by reducing the film thickness of the conductive layer 190, the reduced film thickness of the conductive layer 190 may further lead to induced resistance that is harmful to device performance.

Thus, the semiconductor device and the forming method thereof may also have other example, and are not limited to the aforementioned embodiment. The following description will detail other different embodiments or variant embodiments of the semiconductor device and the forming method thereof in the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 4:
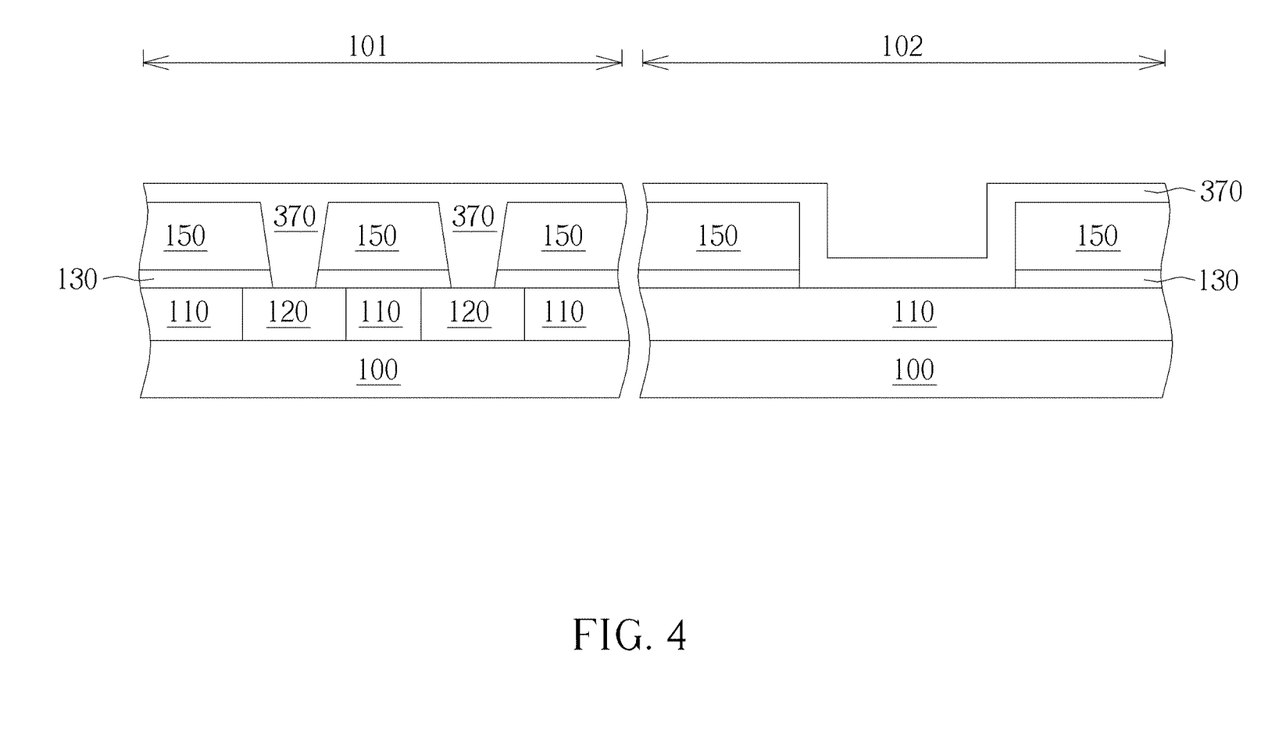
FIG. 4 is a schematic cross-sectional view showing a semiconductor device after forming a tungsten layer.
Figure 5:
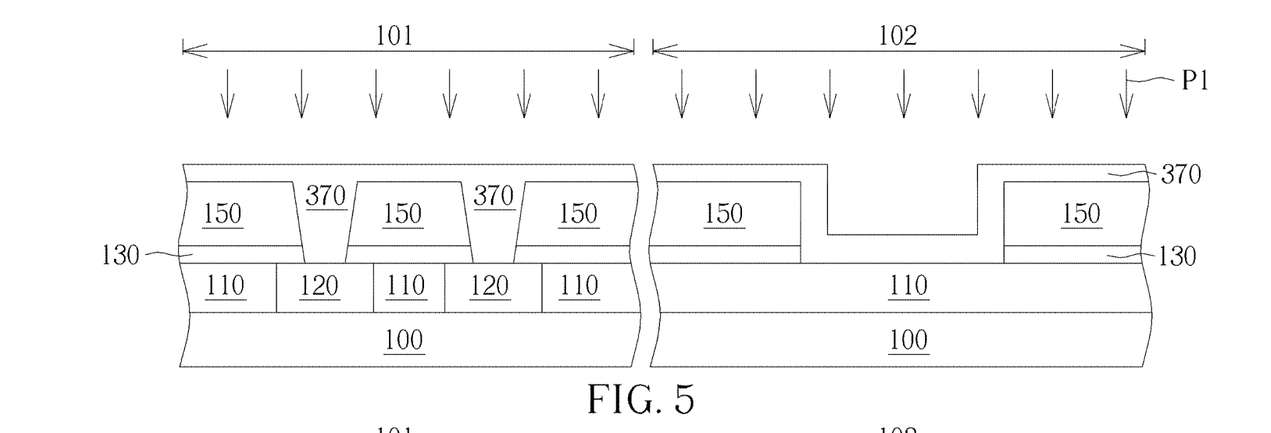
FIG. 5 is a schematic cross-sectional view showing a semiconductor device after performing a treatment process.
Figure 6:
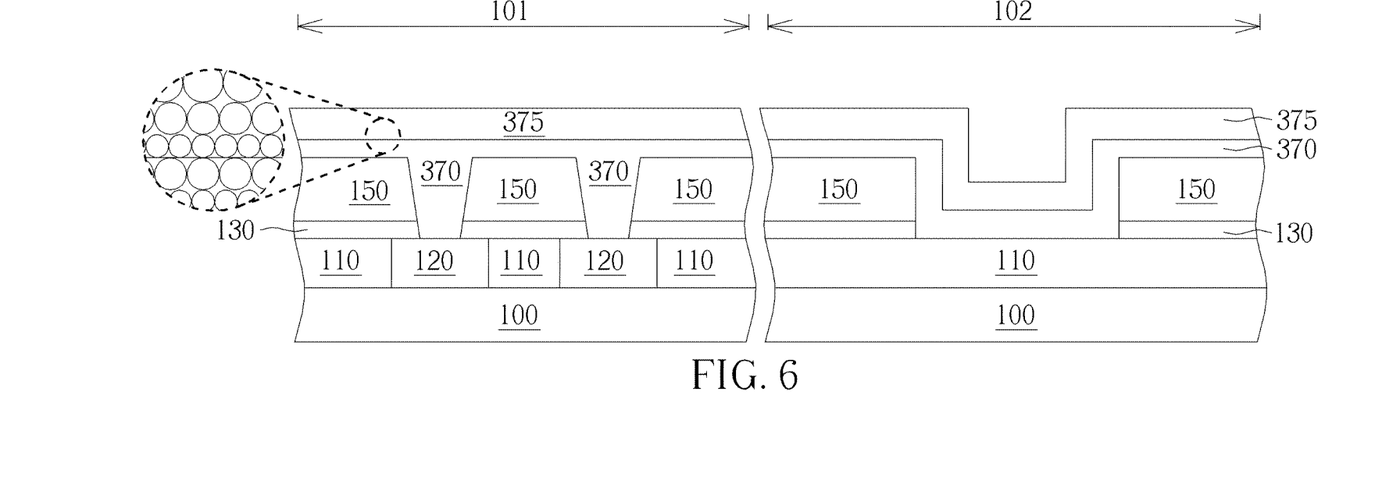
FIG. 6 is a schematic cross-sectional view showing a semiconductor device after forming another tungsten layer.

Referring to FIG. 4 to FIG. 6, a method of forming a semiconductor device according to the second preferred embodiment of the present invention is shown. The formal steps in the present embodiment are substantially similar to those shown in FIG. 1 of the first preferred embodiment, and which will not be redundantly described hereinafter. The differences between the present embodiment and the aforementioned first preferred embodiment are that, the tungsten layer is formed through a two-step CVD process.

Precisely speaking, a first step of CVD process is performed to form a tungsten layer 370, with the film thickness thereof to completely fill in the openings 140 and further cover on surfaces of the dielectric layer 150 and the opening 160, as shown in FIG. 4. Likewise, the grain growth of tungsten are extended upwardly along the crystallization while forming the tungsten layer 370, and the grain size of tungsten is also gradually increased with the film thickness of the tungsten layer 370.

In other words, the tungsten layer 370 that is close to a bottom surface (namely the surface directly in contact with the conductive region 120 or the dielectric layer 110) thereof has a relative smaller grain size of tungsten, for example being about 1 nm to 10 nm, and the tungsten layer 370 that is close to a top surface (namely the surface away from the conductive region 120 or the dielectric layer 110) thereof has a relative larger grain size of tungsten, for example being about 20 nm to 50 nm. It is noted that, the tungsten layer 370 of the present embodiment includes a relative smaller thickness in comparison with that of the tungsten layer 170 of the first embodiment. For example, the thickness of the tungsten layer 370 is about 50 nm to 100 nm, and which is about a half of the entire thickness of the tungsten layer 170 (such as about 100 nm to 200 nm), but is not limited thereto. For this reason, although the grain size of tungsten at the top surface of the tungsten layer 370 is larger than that at any other portion of the tungsten layer 370, such grain size of tungsten is still smaller than the grain size of tungsten at the top surface of the tungsten layer 170. That is, the grain size of tungsten at the top surface of the tungsten layer 370 may not lead to comparatively rough profile or an uneven surface of the tungsten layer 370, as shown in FIG. 4.

As shown in FIG. 5, a treatment process P1 is performed, to interact with the grain growth of tungsten at the top surface of the tungsten layer 370. Precisely, while performing the treatment process P1, a suitable gas or radicals are introduced to the top surface of the tungsten layer 370, to interfere with the crystallization thereof. With such performance, the grain growth of tungsten at the top surface of the tungsten layer 370 is therefore transformed to amorphous tungsten. In one embodiment, the gas or the radicals includes an oxygen-containing gas or an oxygen-containing radical, the oxygen-containing gas is for example selected from one of a group including oxygen ($O_2$), ozone ($O_3$) and nitric oxide (NO), and the oxygen-containing radical is for example selected from one of a group including oxygen radical and oxygen plasma, nitric oxide radical. Furthermore, in another embodiment, the gas or the radicals includes an nitrogen-containing gas or an nitrogen-containing radical, the nitrogen-containing gas is for example selected from one of a group including nitrogen ($N_2$), NO, nitrous oxide ($N_2O$), nitric dioxide ($NO_2$), ammonia ($NH_3$) and hydrazine ($N_2H_4$), and the nitrogen-containing radical is for example selected from one of a group including nitrogen radical, NO radical, NH radical, and $NH_2$ radical. Also, in another embodiment, a processing temperature of the treatment process P1 is set at approximately between 300° C. and 1,000° C., preferably between 300° C. and about 400° C., and for the reaction, approximately between 2 sccm and 4 sccm of the gas or the radicals is introduced for about 5 to 15 seconds. For example, the substrate 100 is heated during the treatment process P1, so as to maintain the temperature of the substrate 100 at about 300° C. to 1,000° C., but is not limited thereto.

Then, a second step of CVD process is performed, to form a tungsten layer 375, and the entire thickness of the two tungsten layers 370, 375 is substantially equal to the thickness (being about 100 nm to 200 nm) of the tungsten layer 170 in the first embodiment, or slightly slight greater than the thickness of the tungsten layer 170 in the first embodiment, such as being about 250 nm. Precisely, after the treatment process P1, the gas or the radical are completely removed for example by selectively performing a physical or a chemical removing process to clean any residue of the gas or the radicals remained on the tungsten layer 370, followed by forming the tungsten layer 375 right on the tungsten layer 370. It is noted that, since the grain growth of tungsten at the top surface of the tungsten layer 370 has been inhibited and then transformed into amorphous tungsten, the grain growth of tungsten of the tungsten layer 375 may be recrystallized instead of continuously extending along the original crystallization of the tungsten layer 370. In other words, the grain size of tungsten of the tungsten layer 375 may not be continuously increased along the original crystallization of the tungsten layer 370. The tungsten layer 375 that is close to a bottom surface (namely the surface directly in contact with the tungsten layer 370) thereof has a relative smaller grain size of tungsten, for example being about 1 nm to 10 nm, and the grain sized of tungsten of the tungsten layer 375 is also gradually increased with the film thickness. The tungsten layer 375 that is close to a top surface (namely the surface away from the tungsten layer 370) thereof has a relative larger grain size of tungsten, for example being about 50 nm to 70 nm. Thus, the grain growth of tungsten at the top surface of the tungsten layer 375 may not have issues of the oversized grain, so as to prevent from the comparatively rough profile or an uneven surface, as shown in FIG. 6.

Through the above mentioned steps, the method of forming a semiconductor device in the second preferred embodiment is completed. According to the present forming method, the two-step CVD process is performed to form the tungsten layers 370, 375, and the treatment process P1 is further performed between the two CVD processes to inhibit the grain growth of tungsten at the top surface of the tungsten layer 370. Under this arrangement, although the entire thickness of the two tungsten layers 370, 375 is substantially equal to that of the tungsten layer 170, the grain size of tungsten at the top surface of the tungsten layer 375 is sufficiently reduced for avoiding the comparative rough, uneven surface that occurred to the tungsten layer 375. After that, the planarization process, the formation of the conductive layer 190, and the subsequent package and dicing processes as described in the first preferred embodiment may also be conducted. Based on the forming method of the present embodiment, issues of the comparatively rough profile or the uneven surface happened on the tungsten layer 375 and the conductive layer formed thereon may both be improved, so that, the subsequent processes such as the dicing process will no longer be affected by these issues. Then, a better element performance may therefore be achieved.

The semiconductor device obtained through the aforementioned forming method includes the dielectric layer 150 disposed on the substrate 100, the openings 140, 160 with different diameters in the dielectric layer 150, the tungsten layer 370 disposed in the openings 140, 160, and the tungsten layer 375 disposed on the tungsten layer 370. The tungsten layer 370 completely fills the openings 140 and only partially fills the opening 160, and the tungsten layer 375 is directly in contact with the top surface of the tungsten layer 370 to partially fill in the opening 160. It is noted that, the grain sizes of the two tungsten layers 370, 375 are both gradually increased from the bottom surface to the top surface thereof, and the grain growth of tungsten at the top surface of the tungsten layer 370 is transformed to amorphous tungsten, so as to form an interface layer (not shown in the drawings of the present embodiment) between the two tungsten layers 370, 375. That is, the tungsten layer 370, the interface layer and the tungsten layer 375 stacked one over another in the opening 160 may therefore form a tungsten stacked structure. Also, since the grain size of tungsten at the top surface of the tungsten layer 375 is about 50 nm to 70 nm, the comparatively rough, uneven surface may no longer present on the tungsten layer 375. Therefore, the semiconductor device obtained from the present embodiment is capable of improving the issues of the comparatively rough profile or the uneven surface of the tungsten layer caused by the oversized grain of tungsten, so as to gain better element performance.

Figure 7:
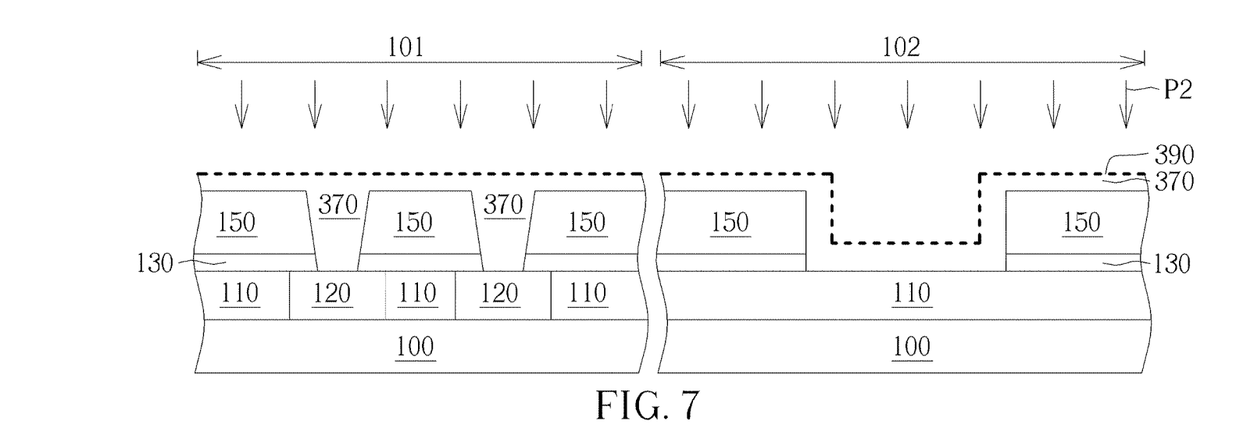
FIG. 7 is a schematic cross-sectional view showing a semiconductor device after forming an interface layer.
Figure 8:
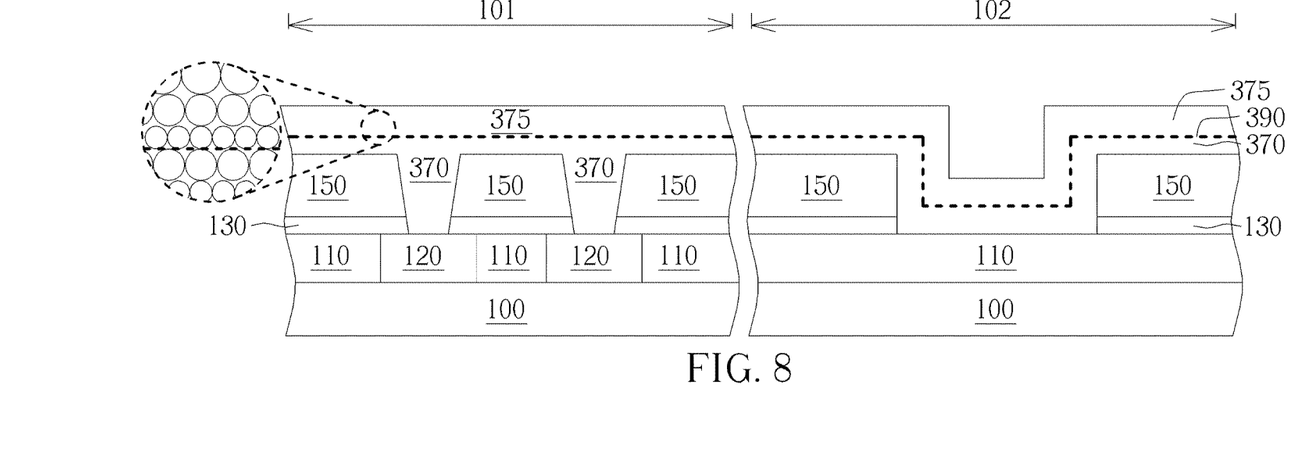
FIG. 8 is a schematic cross-sectional view showing a semiconductor device after forming another tungsten layer.

Referring to FIG. 7 to FIG. 8, a method of forming a semiconductor device according to the third preferred embodiment of the present invention is shown. The formal steps in the present embodiment are substantially similar to those shown in FIG. 1, FIG. 4 of the aforementioned first and the second preferred embodiments, and which will not be redundantly described hereinafter. The differences between the present embodiment and the aforementioned two embodiments are that, the removing process after the treatment process P1 is omitted or the processing parameters, such as the processing temperature, the processing pressure, the process time for inducing gas or radicals, or the processing gas flow, of the treatment process P1 are modified to let a portion of the gas or the radicals remain on the top surface of the tungsten layer 370, to form an interface layer 390 thereby.

Precisely speaking, the treatment process P2 of the present embodiment is also performed to inhibit the grain growth of tungsten at the top surface of the tungsten layer 370, and to let a portion of the gas or the radicals remain on the tungsten layer 370 to form the interface layer 390 as shown in FIG. 7. In one embodiment, while the gas or the radicals include the oxygen-containing gas or the oxygen-containing radical, the interface layer 390 may include an oxygen-containing layer including remaining oxygen, oxygen plasma or oxygen radical. In another embodiment, while the gas or the radicals include the nitrogen-containing gas or the nitrogen-containing radical, the interface layer 390 may include a nitrogen-containing layer including nitrogen, or nitrogen radical.

Then, the second step of the CVD process is performed, to form the tungsten layer 375, so that, the interface layer 390 is disposed between the two tungsten layers 370, 375, as shown in FIG. 8. The interface layer 390 includes the gas or the radical residue from the treatment process P2, which may further inhibit the grain growth of tungsten at the top surface of the tungsten layer 370. That is, the grain growth of tungsten of the tungsten layer 375 may be recrystallized instead of continuously extending along the original crystallization of the tungsten layer 370, so as to obtain a relative smaller grain size. In other words, the tungsten layer 375 that is close to a bottom surface (namely the surface directly in contact with the interface layer 390) thereof has a relative smaller grain size of tungsten, for example being about 1 nm to 10 nm, and the grain sized of tungsten of the tungsten layer 375 is also gradually increased with the film thickness. The tungsten layer 375 that is close to a top surface (namely the surface away from the interface layer 390) thereof has a relative larger grain size of tungsten, for example being about 50 nm to 70 nm. Thus, the grain growth of tungsten at the top surface of the tungsten layer 375 may not have issues of the oversized grain, so as to effectively prevent from comparatively rough profile or an uneven surface, as shown in FIG. 8.

Through the above mentioned steps, the method of forming a semiconductor device in the third preferred embodiment is completed. According to the present forming method, the two-step CVD process is performed to form the tungsten layers 370, 375, and the treatment process P2 is further performed between the two CVD processes to form the interface layer 390 between the two tungsten layers 370, 375. It is noted that, the interface layer 390 formed in the present embodiment may further improve the oversized grain of tungsten. Also, the interface layer 390 has an extremely small thickness, so that, the entire thickness of the interface layer 390 and the two tungsten layers 370, 375 is still substantially equal to that of the tungsten layer 170. After that, the planarization process, the formation of the conductive layer 190, and the subsequent package and dicing processes as described in the first preferred embodiment may also be conducted. Based on the forming method of the present embodiment, the issues of the comparatively rough profile or the uneven surface happened on the tungsten layer 375 and the conductive layer formed thereon are both be improved, so that, the subsequent processes such as the dicing process will no longer be affected by these issues. In this way, a better element performance may therefore achieve.

The semiconductor device obtained through the aforementioned forming method includes the dielectric layer 150 disposed on the substrate 100, the openings 140, 160 with different diameters in the dielectric layer 150, the tungsten layer 370 disposed in the openings 140, 160, and the tungsten layer 375 disposed on the tungsten layer 370. The tungsten layer 370 completely fills the openings 140 and only partially fills the opening 160, and the tungsten layer 375 is directly in contact with the top surface of the tungsten layer 370 to partially fill in the opening 160. It is noted that, the grain sizes of the two tungsten layers 370, 375 are both gradually increased from the bottom surface to the top surface thereof, and the grain growth of tungsten at the top surface of the tungsten layer 370 is transformed to amorphous tungsten, so as to form an interface layer 390 between the two tungsten layers 370, 375. That is, the tungsten layer 370, the interface layer and the tungsten layer 375 stacked one over another in the opening 160 may therefore form a tungsten stacked structure. Also, since the grain size of tungsten at the top surface of the tungsten layer 375 is about 50 nm to 70 nm, the comparatively rough, uneven surface may no longer present on the tungsten layer 375. Therefore, the semiconductor device obtain from the present embodiment is capable of improving the issues of the comparatively rough profile or the uneven surface of the tungsten layer caused by the oversized grain of tungsten, so as to gain better element performance.

Figure 9:
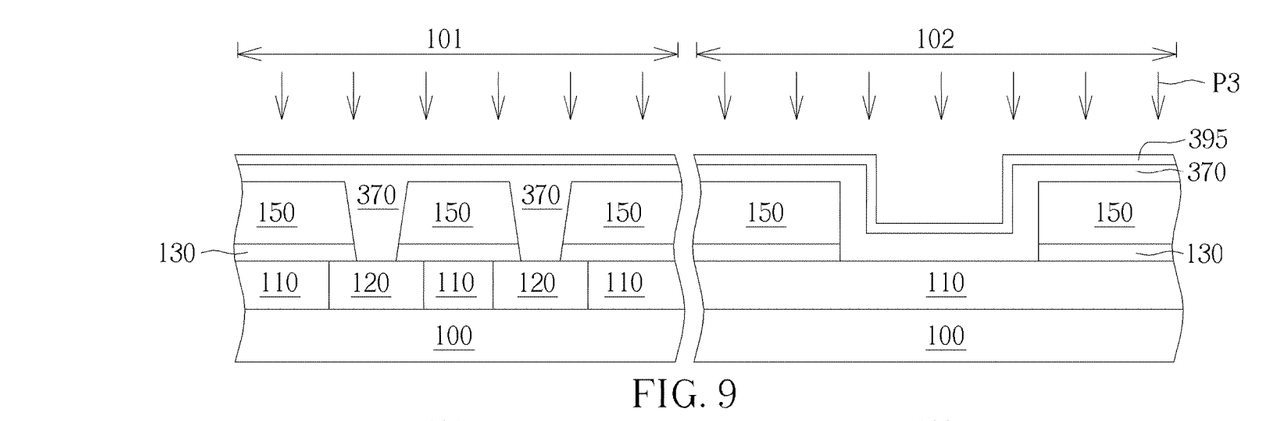
FIG. 9 is a schematic cross-sectional view showing a semiconductor device after forming an interface layer.
Figure 10:
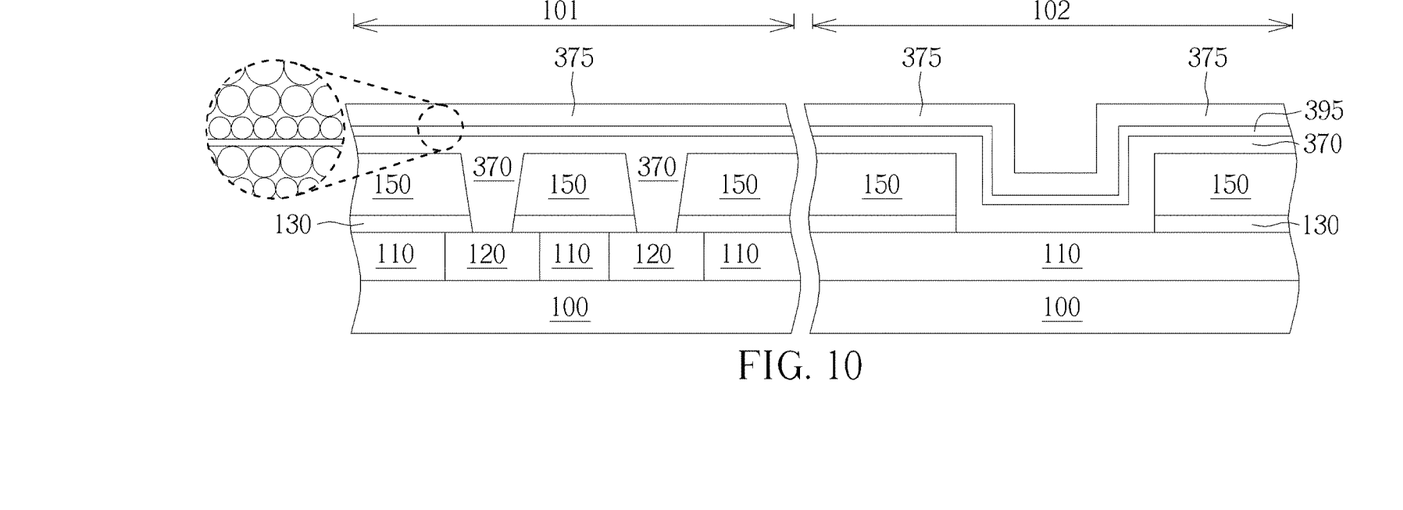
FIG. 10 is a schematic cross-sectional view showing a semiconductor device after forming another tungsten layer.

Referring to FIG. 9 to FIG. 10, a method of forming a semiconductor device according to the fourth preferred embodiment of the present invention is shown. The formal steps in the present embodiment are substantially similar to those shown in FIG. 1, FIG. 4 of the aforementioned second preferred embodiment, and which will not be redundantly descried hereinafter. The differences between the present embodiment and the aforementioned third embodiment are that, the processing parameters, such as the processing temperature, the processing pressure, the process time for inducing gas or radicals, or the processing gas flow, of the treatment process P2 are modified to let a portion of the gas or the radicals to react with tungsten at the top surface of the tungsten layer 370, to form an interface layer 395 thereby.

Precisely speaking, the treatment process P3 of the present embodiment is also performed to inhibit the grain growth of tungsten at the top surface of the tungsten layer 370, to transform the tungsten into amorphous tungsten, and to let a portion of the gas or the radicals remain on the tungsten layer 370 to form the interface layer 395 as shown in FIG. 9. In one embodiment, while the gas or the radicals include the oxygen-containing gas or the oxygen-containing radical, the interface layer 395 may include an oxygen-containing layer for example including tungsten oxide (WO), or tungsten oxynitride (WNO). In another embodiment, while the gas or the radicals include the nitrogen-containing gas or the nitrogen-containing radical, the interface layer 395 may include a nitrogen-containing layer for example including tungsten nitride (WN) or WNO.

It is noted that, the grain sizes of WN, WNO, or WO are smaller than that of tungsten, so that, the grain growth of tungsten of the tungsten layer 375 may still be recrystallized instead of continuously extending along the original crystallization of the tungsten layer 370. In other words, the tungsten layer 375 that is close to a bottom surface (namely the surface directly in contact with the interface layer 395) thereof has a relative smaller grain size of tungsten, for example being about 1 nm to 10 nm, and the grain sized of tungsten of the tungsten layer 375 is also gradually increased with the film thickness. The tungsten layer 375 that is close to a top surface (namely the surface away from the interface layer 395) thereof has a relative larger grain size of tungsten, for example being about 50 nm to 70 nm. Thus, the grain growth of tungsten at the top surface of the tungsten layer 375 may not have issues of the oversized grain, so as to effectively prevent the comparatively rough profile or an uneven surface, as shown in FIG. 10.

Through the above mentioned steps, the method of forming a semiconductor device in the fourth preferred embodiment is completed. According to the present forming method, the two-step CVD process is performed to form the tungsten layers 370, 375, and the treatment process P3 is further performed between the two CVD processes to form the interface layer 395 between the two tungsten layers 370, 375. It is noted that, the interface layer 395 formed in the present embodiment may further improve the oversized grain of tungsten. Also, the interface layer 395 has a relative smaller thickness in comparison with that of the two tungsten layers 370, 375, such as being about 10 angstroms to 20 angstroms, so that, the entire thickness of the interface layer 395 and the two tungsten layers 370, 375 is still substantially equal to that of the tungsten layer 170. After that, the planarization process, the formation of the conductive layer 190, and the subsequent package and dicing processes as described in the first preferred embodiment may also be conducted. Based on the forming method of the present embodiment, the issues of the comparatively rough profile or the uneven surface that occurred on the tungsten layer 375 and the conductive layer formed thereon are both be improved, so that, the subsequent processes such as the dicing process will no longer be affected by these issues. In this way, a better element performance may therefore be achieved.

On the other hand, the semiconductor device obtained through the aforementioned forming method includes the dielectric layer 150 disposed on the substrate 100, the openings 140, 160 with different diameters in the dielectric layer 150, the tungsten layer 370 disposed in the openings 140, 160, and the tungsten layer 375 disposed on the tungsten layer 370. The openings 140 are completely filled by the tungsten layer 370, and the interface layer 395 and the tungsten layer 375 are stacked thereon. On the other hand, the tungsten layer 370, the interface layer and the tungsten layer 375 are stacked one over another in the opening 160, to form a tungsten stacked structure, and the tungsten stacked structure only partially fills the opening 160. Therefore, the semiconductor device obtained from the present embodiment is capable of improving the issues of the comparatively rough profile or the uneven surface of the tungsten layer caused by the oversized grain of tungsten, so as to gain better element performance.

Overall speaking, the present invention utilizes a two-step CVD process to form two tungsten layers, and further utilizes a treatment process between the two CVD processes to inhibit the grain growth of tungsten by introducing a suitable gas or radicals to a top surface of the bottom tungsten layer to interfere with the original crystallization, and to transfer the grain growth of tungsten thereof into amorphous tungsten. That is, the top tungsten layer deposited on the bottom tungsten layer may be recrystallized to obtain a relative smaller grain size instead of continuously extended along the original crystallization of the bottom tungsten layer. In this way, the forming method of the present invention is capable of improving issues of the oversized grain of the top tungsten layer, and the subsequent processes such as the dicing process will no longer be affected by these issues. In this way, the semiconductor device obtained via aforementioned forming method in the present invention may therefore gain a better element performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   a dielectric layer, disposed on the substrate and having a first opening and a second opening with a diameter larger of the first opening;
   a first tungsten layer disposed in the first opening and the second opening to fill the first opening;
   a second tungsten layer disposed on the first tungsten layer, wherein a grain size of the second tungsten layer gradually increases from a bottom surface to a top surface of the second tungsten layer; and
   an interface layer disposed between the first tungsten layer and the second tungsten layer, wherein the interface layer comprises a nitrogen-containing layer.

2. The semiconductor device according to claim 1, wherein
   a grain size of the first tungsten layer disposed in the first opening gradually increases from a bottom surface to a top surface of the first tungsten layer.

3. The semiconductor device according to claim 1, further comprising:
   a conductive region disposed in the substrate, wherein the first tungsten layer directly contacts the conductive region; and
   a conductive layer disposed on the second tungsten layer.

4. A semiconductor device, comprising:
   a substrate;
   a dielectric layer, disposed on the substrate and having a first opening and a second opening with a diameter larger of the first opening;
   a first tungsten layer, completely filled in the first opening; and
   a tungsten stacked structure disposed in the second opening, wherein the tungsten stacked structure comprises the first tungsten layer, an interface layer and a second tungsten layer stacked sequentially from bottom to top, and the interface layer comprises a nitrogen-containing layer.

5. The semiconductor device according to claim 4, wherein
   a grain size of the second tungsten layer gradually increases from a bottom surface to a top surface of the second tungsten layer.

6. A method of forming a semiconductor device, comprising:
   forming a dielectric layer on a substrate, the dielectric layer having a first opening and a second opening with a diameter larger than a diameter of the first opening;
   forming a first tungsten layer, completely filled in the first opening and partially filled in the second opening;
   introducing a nitrogen-containing gas or a nitrogen-containing radical to a top surface of the first tungsten layer, to form an interface layer on the first tungsten layer; and
   forming a second tungsten layer on the interface layer.

7. The method of forming semiconductor device according to claim 6, wherein the nitrogen-containing gas comprises nitrogen ($N_2$), nitric oxide (NO), nitrous oxide ($N_2O$), nitrogen dioxide ($NO_2$), ammonia ($NH_3$), hydrazine ($N_2H_4$), or a mixture thereof, and the nitrogen-containing radical comprises nitrogen radical, NO radical, NH radical, or $NH_2$ radical, or a mixture thereof.

8. The method of forming semiconductor device according to claim 6, wherein the treatment process comprises:
   maintaining the substrate at a temperature between about 300° C. and about 1,000° C.

9. The method of forming semiconductor device according to claim 6, further comprising:
   performing a planarization process, to remove the first tungsten layer and the second tungsten layer disposed on the dielectric layer; and
   forming a conductive layer, after the planarization process.

10. The method of forming semiconductor device according to claim 6, wherein a grain size of the second tungsten layer gradually increases from a bottom surface to a top surface of the second tungsten layer.

* * * * *

UNITED STATES PATENT AND TRADEMARK OFFICE
CERTIFICATE OF CORRECTION

PATENT NO. : 10,465,287 B2
APPLICATION NO. : 15/919191
DATED : November 5, 2019
INVENTOR(S) : Chih-Chien Liu et al.

It is certified that error appears in the above-identified patent and that said Letters Patent is hereby corrected as shown below:

On the Title Page

Item (73), correct the name of the 1st assignee from "UNITED MICROELECTRONCIS CORP." to --UNITED MICROELECTRONICS CORP.--.

Signed and Sealed this
Thirty-first Day of December, 2019

Andrei Iancu
*Director of the United States Patent and Trademark Office*